April 18, 1967 G. C. CHERNISH 3,315,178

TRANSISTOR OSCILLATOR FOR EXTENDED FREQUENCY OPERATION

Filed Nov. 16, 1964

Inventor
George C. Chernish
By Ira Milton Jones
Attorney.

United States Patent Office 3,315,178

Patented Apr. 18, 1967

3,315,178

TRANSISTOR OSCILLATOR FOR EXTENDED FREQUENCY OPERATION

George C. Chernish, Escondido, Calif., assignor to DoAll Science Center, Inc., Escondido, Calif., a corporation of Illinois Filed Nov. 16, 1964, Ser. No. 411,201
9 Claims. (Cl. 331—114)

The present invention relates to electronic oscillators. More particularly, the invention relates to electronic oscillators for powering an ultrasonic transducer.

In ultrasonic generators, it is necessary to deliver large amounts of power at high frequencies. Conventional ultrasonic generators utilize power transistors of the germanium variety rather than the silicon variety because of the large cost difference. However, the quality power transistors of the germanium variety are useful only to approximately 5 kc., while the efficiency of the very best of these devices falls drastically as the electronic switching rate exceeds 10 kc.

Present ultrasonic frequencies, particularly for ultrasonic cleaners and machine tools, range from 20 kc. to 40 kc., in the main. Various methods have been devised whereby 10 kc. power transistors may be switched at a 20 kc. rate. Most of these schemes utilize a capacitive circuit for correcting the serious phase shift which results when a transistor exceeds its frequency capability. However, the efficiency under the best circumstances rarely exceeds fifty percent (50%).

The foregoing disadvantages are overcome in the present invention by providing an oscillator circuit which produces a frequency equal to twice the switching rate of the transistors used. Thus, using the present inventon for ultrasonic generation, the transistors are switched at their optimum rate at high efficiency and the circuit produces a frequency which is twice the switching rate. It is therefore possible, using the present invention, to achieve high power, high efficiency, and high frequency operation with a solid state oscillator.

It is therefore an object of the invention to provide a solid state oscillator capable of having an output frequency which is twice the switching rate of the solid state switching elements.

It is also an object of the present invention to provide a new and improved transistorized generator capable of delivering very large amounts of ultrasonic power at high efficiency, so that smaller, less costly and more reliable generators may be used on a given work load.

A further object of the present invention is to provide a self-tuned ultrasonic generator which requires no additional circuitry in order to achieve automatic frequency control. Manual re-tuning of the generator is eliminated through an inherent feature of the new circuit.

Other objects of the invention will be pointed out in the following description and claims and illustrated in the accompanying drawings, which disclose, by way of example, the principle of the invention and the best mode which has been contemplated of applying that principle.

Figures 1, 2:
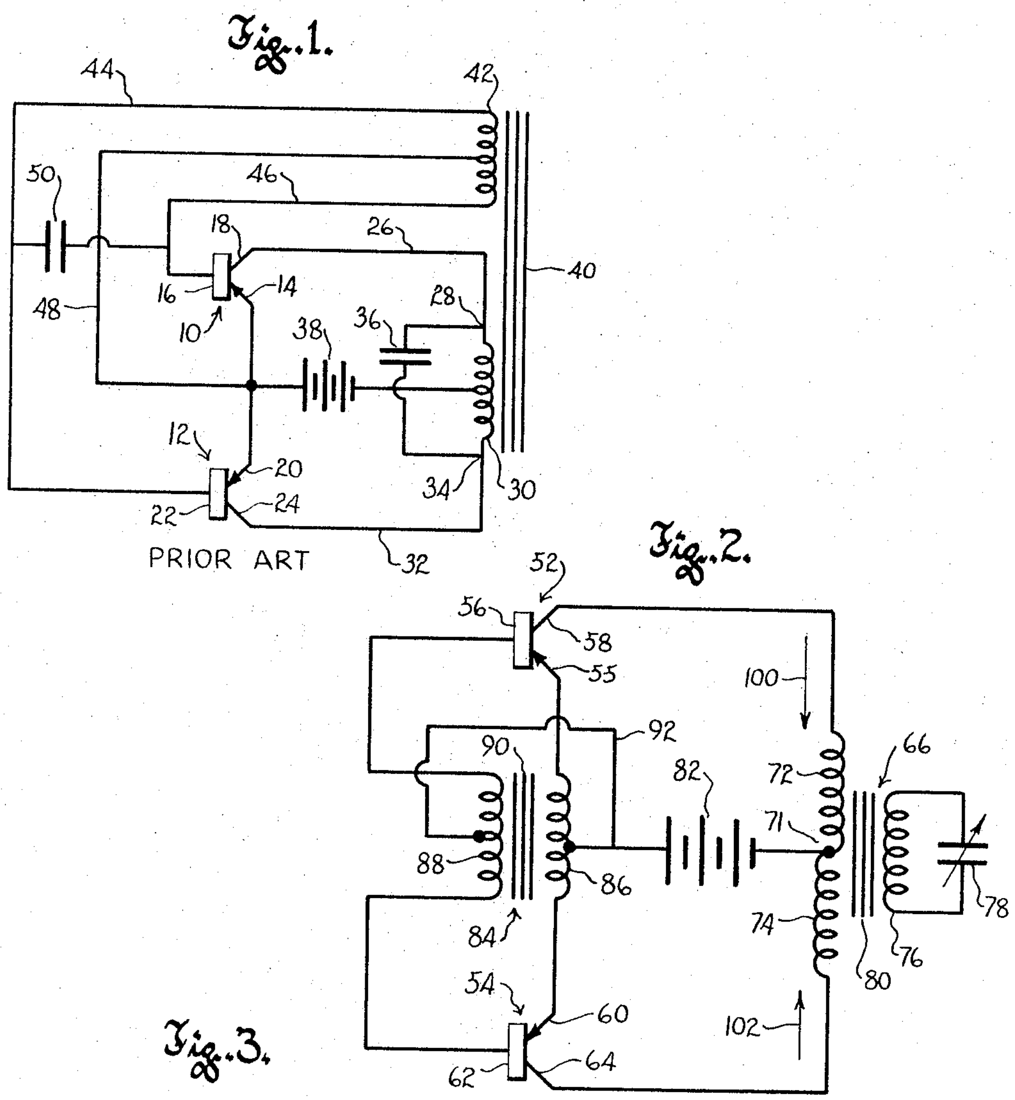
FIGURE 1 is a schematic of a prior art solid state oscillator.
FIGURE 2 is a schematic of the solid state oscillator of the present invention.

In FIGURE 1, the prior art oscillator comprises transistors 10 and 12. Collector 18 of transistor 10 is connected at point 28 to primary coil 30 by means of lead 26. Coil 30 is the primary of a transformer comprising a secondary coil 42 and a core 40. The core 40 may be a transducer which can be used for ultrasonic operations such as cleaning. Collector 24 of transistor 12 is connected to coil 30 at point 34 by means of lead 32. A capacitor 36 is connected across coil 30. Capacitor 36 and coil 30 provide a tuned circuit which determines the frequency of operation of the prior art oscillator.

Coil 42 is connected at one end to base 22 of transistor 12 by means of lead 44. The other end of coil 42 is connected by means of lead 46 to the base 16 of transistor 10. A lead 48 is connected between the midpoint of coil 42 and emitters 14 and 20 of transistors 10 and 12, respectively. A power supply 38 is connected between the midpoint of coil 30 and emitters 14 and 20. A capacitor 50 is connected across coil 42.

As is well known, in the prior art, the circuit shown in FIGURE 1 operates at a frequency F determined by the tuned circuit comprising capacitor 36 and coil 30. The frequency F is fed back to the control terminals of the transistors by means of secondary coil 42. The control signal fed back to the transistors by secondary coil 42 maintains the transistors switching alternately at a frequency F. Thus, for ultrasonic operation, the transistors must switch at the desired frequency rate which is above their optimum frequency thereby causing low efficiency operation.

In the oscillator shown in FIGURE 2, the output circuit produces a frequency at twice the switching rate of the transistors. Transistors 52 and 54 have their respective collectors 58 and 64 connected to the primary of a transformer 66. Transformer 66 comprises a primary coil made up of sections 72 and 74, a secondary coil 76 and a core 80. The core 80 may be a transducer, such as a magneto-strictive transducer, for ultrasonic operations. It is noted that coil 71 has two sections, 72 and 74. Section 74 is wound in opposing relation to coil 72. A capacitor 78 is connected across secondary coil 76 for providing a tuned circuit.

A second transformer 84, has a primary coil 86 connected between emitters 55 and 60 of transistors 52 and 54, a secondary coil 88 connected between the bases 56 and 62 of transistors 52 and 54, and a core 90. A power supply 82 is connected at one end to the midpoint of coil 86 and at the other end to the junction of sections 72 and 74 of coil 71. A lead 92 connects the midpoints of coils 86 and 88.

Figure 3:
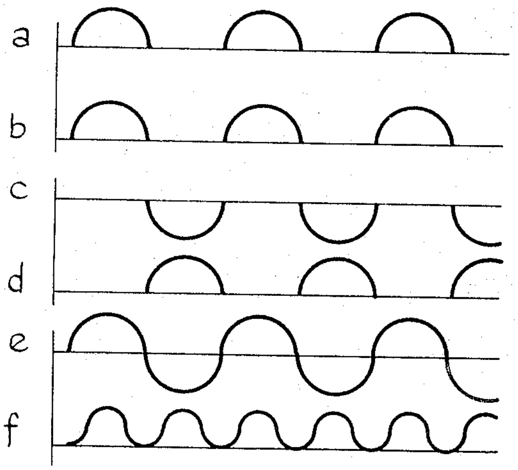
FIGURE 3 is a series of graphs helpful in explaining the operation of the circuit shown in FIGURE 2.

The operation of the oscillator shown in FIGURE 2 will be explained with reference to the time graphs shown in FIGURE 3. Transistors 52 and 54 of the oscillator are connected in push-pull relation. The frequency of operation is determined by the tuned circuit comprising coil 76 and capacitor 78. Due to the oscillating current in the feedback transformer 84, the transistors are alternately switched on and off at the frequency of the feedback current.

Upon energization of the circuit, transistor 52 begins conducting and supplies current to the upper half of coil 71. FIGURE 3*a* is a graph showing the current variation in section 72 of coil 71 when transistor 52 is on. The current path from the transistor 52 is from the collector 58 to the coil section 72 through coil 86 and back to the transistor via emitter 55. The current 100 in coil section 72 is illustrated graphically by FIGURE 3*a*. The variation in electromagnetic field caused by the current variation is shown in FIGURE 3*b*. It is noted that an increasing current in the direction indicated by arrow 100 causes an increase in the electromagnetic field in the up direction, as shown in FIGURE 3*b*.

When transistor 54 is conducting the current passes from collector 64 through the section 74 of coil 71 to coil 86 and back to transistor 54 via emitter electrode 60. The direction of this current is indicated by the arrow 102. The current 102 in section 74 of coil 71 is illustrated graphically in FIGURE 3*c*. It is noted that the direction of this current is opposite to the direction of the current 100. Also, the current 102 flows when transistor 54 is conducting and transistor 52 is non-conducting. The electromagnetic field created by the current 102 is shown in FIGURE 3*d*. An increase in current 102 also causes an increase in the electromagnetic field in the up direction. The reason for this is that section 74 is wound in opposing relation to section 72. Therefore, even though currents 100 and 102 flow in opposite directions, they vary the electromagnetic field in the same direction.

Consequently, the total current flowing in coil 71, as shown in FIGURE 3*e*, is at a first frequency and the electromagnetic field variation, as shown in FIGURE 3*f*, is at a frequency twice the frequency of the current flowing in coil 71. Currents 100 and 102 are fed back to the respective transistors 52 and 54 through coil 86. Since the coils 86 are not wound in opposing relation, the frequency of the electromagnetic field set up by the current in coil 86 is the same as the current frequency. The alternating field set up by coil 86 is transformed into an alternating signal of the same frequency in coil 88. Since coil 88 is connected to base 56 of transistor 52 and base 62 of transistor 54, these transistors are maintained switching at the frequency of the current. Thus the frequency at which the transistors are switched is half the output frequency so that if the frequency of the tuned circuit comprising coil 76 and capacitor 78 is set at 20 kc., the electromagnetic field created in coil 71 will be varying at 20 kc. but the transistors will be switching at only a 10 kc. rate.

The circuit of FIGURE 2 also has an inherent self-tuning feature. Assuming that 80 designates a magnetostrictive transducer, coils 71 and 76 comprise the coils of the magnetostrictive transducer. Due to variations in temperature, work load, and/or line voltage, the natural resonant frequency of the transducer decreases about 2 percent. Unless the switching rate of the transistors is adjusted to compensate for the decrease in resonant frequency of the transducer, the circuit will de-tune. However, since the switching current also flows through coil 86, the change in overall circuit inductance (caused by the temporary magnetic changes in the transducer) results in an immediate change in the frequency of the voltage induced in coil 88, since both coils 86 and 88 are wound on a common core. This latter induced voltage has now shifted in frequency to switch the transistors at the newly required rate, thus accomplishing automatic tuning.

The circuit shown in FIGURE 2 also eliminates the need for extreme care in acoustic matching when a transducer is being bonded to an ultrasonic cleaning tank. Normally, the transducers must be many times larger physically than required by the electrical circuit solely because of the need to present a large surface area to the cleaning tank in order to get good acoustic coupling. Since the need for extreme care in acoustic matching is eliminated by the circuit of FIGURE 2, the transducers used may be smaller than those presently used.

Another feature of the circuit shown in FIGURE 2 resides in the fact that it utilizes the principle of electrodynamic loading to good and very useful purpose when the circuit is used to provide electrical energy to drive a transducer. Briefly, an ultransonic transducer must be matched acoustically as well as electrically, to its load. In high intensity systems, it is often virtually impossible to impart high-level ultransonic energy to a small load, due to the wide variance in acoustic impedance. However, with this invention the resonant circuit provided by the series connected secondary coil 76 and the capacitor 78 loads the transducer to any pre-set level. This artificial loading varies dynamically to maintain transducer activity at an optimum level, regardless of changes in loading, acoustic impedance or line voltage.

Still another advantageous feature of the invention is that it enables ultrasonic vibrations at two harmonically related frequencies to be produced by a single generator. The cleaning of certain objects by ultrasonic vibrations introduced into the solvent or cleaning solution, is materially enhanced when vibrations at two harmonically related frequencies are used—as, for instance, 40 kc. and 20 kc. Heretofore this required the use of two generators or one generator with duplicate sections; but with this invention it can be done by the one generator shown in FIGURE 2. The current flowing through coils 86 and 88 is at a frequency half that of the current flowing through coil 76. Hence, if the core 90 is made of magnetostrictive material, it provides a second transducer which is thus obtained at practically no extra cost, and which operates at half the frequency of the first transducer provided by the core 80.

While there have been shown and described and pointed out the fundamental novel features of the invention as applied to the preferred embodiment, it will be understood that various omissions and substitutions and changes in the form and details of the device illustrated and in its operation may be made by those skilled in the art without departing from the spirit of the invention. It is the intention, therefore, to be limited only as indicated by the scope of the following claims.

What is claimed as my invention is:

1. An oscillator for generating a signal at a frequency 2F, comprising:

(A) a first transformer having a primary coil and a secondary coil, said primary coil having first and second sections wound in opposing relation to one another, (A') a capacitor connected across said secondary coil, (B) first and second switching elements each having a control input and an output, (C) means for connecting the outputs from said first and second switching elements to said first and second sections respectively, and (D) feedback means connected between the outputs of said first and second switching elements and said control inputs of said first and second switching elements for causing said switching elements to switch at frequency F.

2. The oscillator set forth in claim 1, wherein said feedback means includes a second transformer.

3. The oscillator set forth in claim 1, wherein said switching elements are transistors.

4. The oscillator set forth in claim 2, wherein both of said transformers have cores of magnetostrictive material so that said transformers constitute transducers generating signals at harmonically related frequencies F and 2F.

5. An oscillator comprising:

(A) first and second transistor elements each having first, second and third terminals;

(B) a first transformer having a primary coil and a secondary coil, said primary coil having first and second sections wound in opposing relation to one another;

(C) a capacitive element connected across said secondary coil of said first transformer;

(D) means for connecting said first terminals of said first and second transistors to said first and second sections respectively;

(E) a second transformer having a primary coil and a secondary coil;

(F) means for connecting said primary coil of said second transformer between the second terminals of said first and second transistors;

(G) means for connecting said secondary coil of said second transformer between the third terminals of said first and second transistors; and (H) means for connecting the primary coil of said second transformer to the primary coil of said first transformer.

6. The oscillator set forth in claim 5, wherein said first transformer further comprises a core, said core being a magnetostrictive transducer.

7. The oscillator set forth in claim 5, wherein the coils of said first transformer are wound upon a core of magnetostrictive material.

8. The oscillator as claimed in claim 5 further comprising connector means for connecting the primary and secondary windings of said second transformer together at substantially their midpoints.

9. The oscillator as claimed in claim 5 wherein said last mentioned means includes a source of D.C. power.

References Cited by the Examiner

UNITED STATES PATENTS

| | | | |
|---|---|---|---|
| 3,093,809 | 6/1963 | Watlington | 331—114 X |
| 3,151,284 | 9/1964 | Kleesattel | 318—118 |
| 3,177,416 | 4/1965 | Pijls et al. | 318—118 |
| 3,223,907 | 12/1965 | Blok et al. | 331—157 X |

OTHER REFERENCES

Johnson, "High-Power Transistorized Mobile Power Supply," QST, April 1958, pp. 11–16 (p. 12 relied on).

ROY LAKE, *Primary Examiner.*

J. B. MULLINS, *Assistant Examiner.*